United States Patent
Oppelt

(10) Patent No.: US 6,317,091 B1
(45) Date of Patent: Nov. 13, 2001

(54) APPARATUS FOR INDUCTIVELY COUPLING A NUCLEAR MAGNETIC RESONANCE SIGNAL INTO A RECEPTION ANTENNA, AND MEDICAL INSTRUMENT INCORPORATING SUCH AN APPARATUS

(75) Inventor: Arnulf Oppelt, Spardorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/406,702

(22) Filed: Sep. 28, 1999

(30) Foreign Application Priority Data

Sep. 29, 1998 (DE) ................................ 198 44 762

(51) Int. Cl.⁷ .................................... H01Q 11/12
(52) U.S. Cl. .......................... 343/742; 343/867; 324/318
(58) Field of Search ..................... 343/866, 867, 343/742; 324/741, 322; 5/318; H01Q 11/12

(56) References Cited

U.S. PATENT DOCUMENTS

| | | | |
|---|---|---|---|
| 3,689,885 | * 9/1972 | Kaplan et al. | 340/152 T |
| 4,130,759 | * 12/1978 | Haimson | 250/445 |
| 4,680,549 | 7/1987 | Tanttu | 324/318 |
| 4,932,411 | 6/1990 | Fritschy et al. | 128/653 A |
| 5,198,768 | 3/1993 | Keren | 324/318 |
| 5,512,828 | * 4/1996 | Pausch et al. | 324/309 |
| 5,602,557 | 2/1997 | Duerr | 343/742 |
| 5,933,007 | * 8/1999 | Schommer et al. | 324/318 |
| 5,973,495 | * 10/1999 | Mansfield | 324/322 |

* cited by examiner

Primary Examiner—Don Wong
Assistant Examiner—Shih-Chao Chen
(74) Attorney, Agent, or Firm—Schiff Hardin & Waite

(57) ABSTRACT

An apparatus for inductively coupling a nuclear magnetic resonance signal into a reception antenna has three resonant coil arrangements that are decoupled from one another and which have respective imaging areas oriented perpendicularly to one another and at least partially overlapping. A medical intervention instrument carries such an apparatus for inductive coupling arranged at its invasive section.

10 Claims, 3 Drawing Sheets

APPARATUS FOR INDUCTIVELY COUPLING A NUCLEAR MAGNETIC RESONANCE SIGNAL INTO A RECEPTION ANTENNA, AND MEDICAL INSTRUMENT INCORPORATING SUCH AN APPARATUS

BACKGROUND OF THE INVENTION

1. Field of the Invention

The present invention is directed to an apparatus for inductively coupling a nuclear magnetic resonance signal into a reception antenna having a resonant coil arrangement that has an imaging area.

The invention is also directed to a medical intervention instrument that is connected to such an apparatus for inductively coupling a nuclear magnetic resonance signal into a reception antenna.

2. Description of the Prior Art

An apparatus of the above type is disclosed in U.S. Pat. No. 4,680,549. It is stated therein that a nuclear magnetic resonance signal from a limited area of an examination subject to be imaged can be noticeably enhanced when a separate set of coils that are closed to form a resonant circuit is arranged in immediate proximity to the area. The separate set of coils has no electrical connection to the rest of the apparatus. The precessing nuclear magnetization then induces a current in the resonant coil arrangement, this current in turn inducing an additional signal in a reception antenna that is significantly greater than the signal which is directly induced in the reception antenna by the precessing nuclear magnetization itself. The signal-to-noise ratio in the area of the image, which corresponds to the area covered by the induction coil, is noticeably improved. A detuning means in the form of two diodes connected with opposite polarities is connected to the resonant reception coil arrangement so that the excitation field is not locally modified when transmitting with a separate transmission antenna, i.e. when exciting the nuclear magnetic spins.

The improvement of the signal-to-noise ratio of the inductively coupled, signal-intensifying resonant circuit and of the resonant coil arrangement is dependent on the quality (Q) of the coil arrangement and on the angle of the imaging area of the resonant coil arrangement relative to the basic magnetic field direction. When the two reside parallel to one another, no improvement derives. This is disadvantageous when, for example, a resonant coil arrangement is to be attached to a surface of the subject to be imaged, if the surface only allows an alignment of the imaging area of the resonant coil arrangement parallel to the basic magnetic field.

On the other hand, circularly polarizing antenna arrangements are known that have two sub-antenna arrangements arranged perpendicularly to one another. Such arrangements thus have antenna characteristics perpendicular to one another that must in turn be aligned perpendicularly to the basic magnetic field direction. For example, a circularly polarizing antenna arrangement disclosed in U.S. Pat. No. 5,602,557 has two sub-antenna arrangements arranged perpendicularly to one another, with each sub-antenna arrangement comprising two saddle-shaped antenna conductors arranged opposite one another. The imaging area is located between the saddle-shaped antenna conductors.

U.S. Pat. No. 5,198,768 discloses an antenna array having dipole and quadrupole antennas.

German OS 34 29 386, corresponding to U.S. Pat. No. 4,932,411, discloses a small antenna for a nuclear magnetic resonance tomography apparatus that can be directly introduced into body organs, for example into the brain, into the liver or into the kidney, via channels. It is attached to the end of a thin plastic carrier.

SUMMARY OF THE INVENTION

An object of the present invention is to provide an apparatus for inductively coupling a nuclear magnetic resonance signal, wherein the signal-intensifying effect is independent of the alignment of the apparatus in the basic magnetic field.

Another object of the present invention is to provide an interventional instrument that can be well-localized, independently of its alignment, using nuclear magnetic resonance technology.

The first object is achieved in an apparatus wherein three resonant coil arrangements are provided (in contrast to the conventional single resonant coil arrangement), these being decoupled from one another and their imaging areas being perpendicular relative to one another and at least partially overlapping. As a result an intensified signal is coupled into the reception antenna from the apparatus independently of the alignment of the apparatus. Ideally, this signal is even higher than that of a resonant single-coil arrangement inductively coupled perpendicular to the basic magnetic field, because the circular polarization of the nuclear magnetization is now always utilized in the inventive apparatus.

In the simplest case, a triplet of resonant dipole antennas or toroidal coils can be employed.

In an embodiment the coils are arranged around a common center and their symmetry axes are perpendicular to one another. The decoupling of the coil arrangements from one another thus achieved exclusively by means of the geometrical arrangement.

When it is intended to apply an arrangement for inductively coupling a nuclear magnetic resonance signal into a reception antenna on a surface of a subject to be imaged, one would expect, if only resonant dipole coils were used, a poor coupling to the subject by the dipole coils standing off from the surface of the subject, and thus only a slight signal amplification would be expected. To avoid this problem, in a further embodiment the arrangement for inductive coupling of a nuclear magnetic resonance signal has at least one resonant quadrupole coil, for example in the form of a butterfly coil or figure-eight coil. Due to the rapidly decaying quadrupole field of the butterfly coil with increasing spacing, however, no noticeable signal boost would be achieved at a greater distance from the reception antenna. A resonant dipole coil therefor is arranged perpendicularly to the resonant quadrupole coil and coupled thereto. The magnetic quadrupole field of the butterfly coil then proceeds through the further resonant dipole coil and induces a current therein, and the magnetic field of this further resonant dipole coil then produces the inductive coupling of the quadrupole coil to the reception antenna.

There is often a desire in magnetic resonance tomography-guided interventions to display, in a tomogram, the position of an interventional instrument, for example a biopsy arrangement, an endoscope or a pointer for designating a location at the examination subject. It is often advantageous when endoscopic nuclear magnetic resonance images can be prepared directly on site with the interventional instrument. In any case, it be important that this display is independent of the alignment of the interventional instrument.

The aforementioned second object is achieved by arranging apparatus for inductively coupling a nuclear magnetic resonance signal at an invasive part of a medical interventional instrument, this apparatus having three orthogonal imaging areas that at least partially overlap.

The apparatus for inductively coupling a nuclear magnetic resonance signal can be to a catheter or to an interventional instrument and thus allows tracking (localization and navigation) of the instrument in the body using nuclear magnetic resonance technology. Either blood flowing through the apparatus or a specimen with protons, for example paramagnetically doped water, introduced into the marking coils can serve as visible marking of the location in the application with a catheter. Tracking thus can be accomplished using a transmission power that is reduced in comparison to that required for imaging, because the excitation field emitted by a transmission antenna is intensified by the resonant coil arrangements. Since the reduced transmission power is inadequate for exciting the examination subject to nuclear resonance, only the signal of the marking coils inductively coupled into the reception coil appears as the reception signal. The position of the marking coils can be derived from three reception signals registered in orthogonal magnetic gradient fields and, for example, can be entered into a previously registered image. The signal of the marking coils, however, also can be utilized for imaging the area surrounding the marking coils.

In an embodiment for use when imaging with the normal reception coil should ensue simultaneously during tracking and navigation of the instrument, the resonant coil arrangements are respectively connected to detuning circuits. The detuning circuits detune the otherwise resonant coil arrangements given activated transmission antenna, and as a result the transmission field is not intensified in the region of the resonant coil arrangements. Operation can thus take place with the normal transmission power, and the nuclear magnetic resonance signal arising from the examination subject—which is employed for imaging—and that arising from the resonant coils attached to the interventional instrument are then superimposed in the reception coil, which leads to a signal-intensified presentation in the image of the imaging area of the coils attached to the interventional instrument. If, by contrast, these coils were not provided with detuning circuits, the transmission field strength would be too high during transmission, so that the nuclear spins would not be tilted from the equilibrium position with the optimum angle, and thus would only supply an inadequate signal.

Insofar as the apparatus for inductive coupling of a nuclear magnetic resonance signal is utilized as a localization aide for an interventional instrument or the like, a specimen having material which emits nuclear magnetic resonance signals and serving as marking is arranged in the shared imaging area of the reception coil arrangements, according to a further embodiment.

DESCRIPTION OF THE PREFERRED EMBODIMENTS

Figure 1:
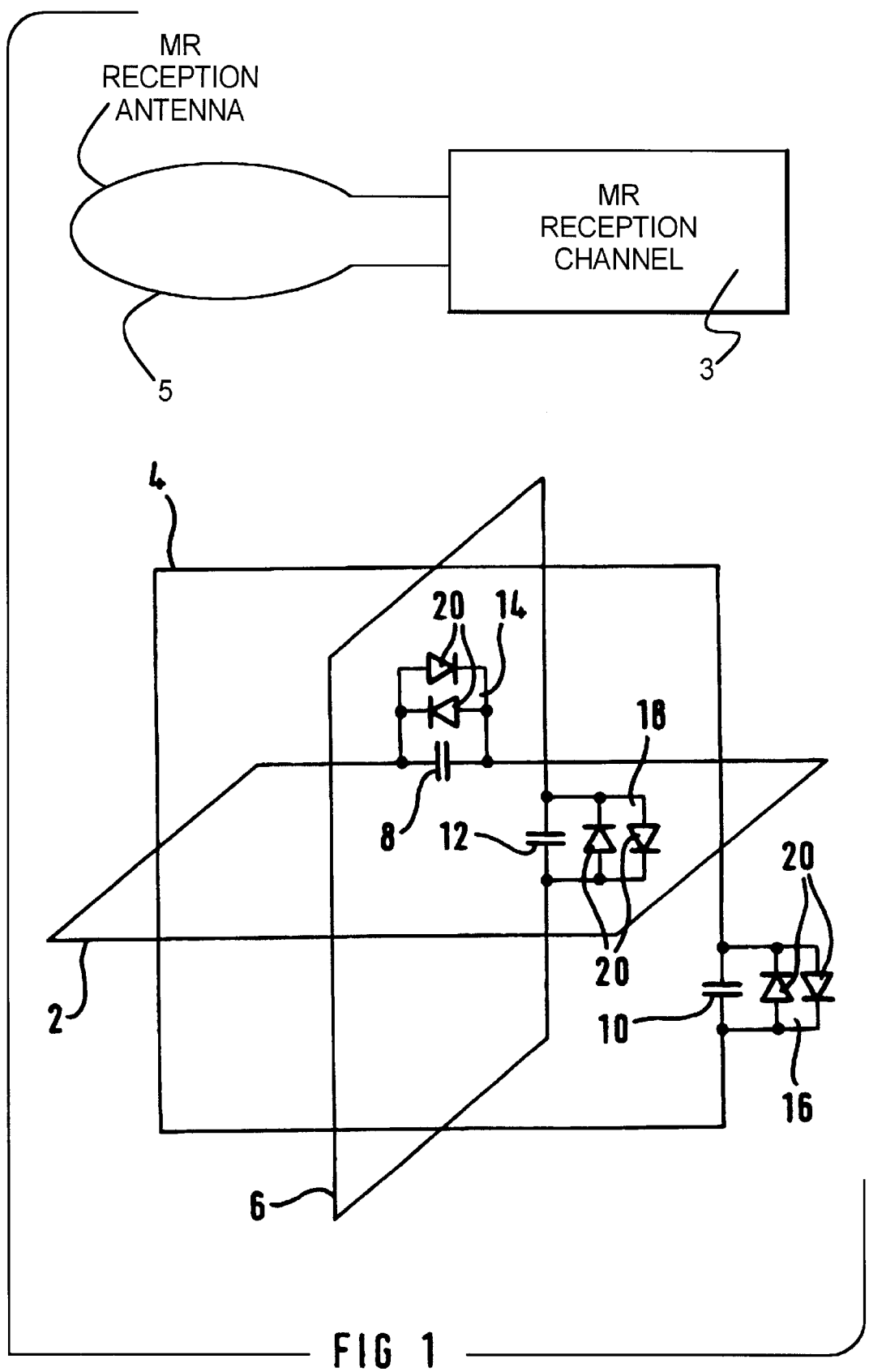
FIG. 1 is a schematic, perspective illustration of a first embodiment of an apparatus for inductively coupling a nuclear magnetic resonance signal into a reception antenna with a triplet of three orthogonal resonant dipole coils having a common center.

A first embodiment of an apparatus for inductive coupling of a nuclear magnetic resonance signal is shown in FIG. 1 and can be employed, for example, as a local antenna in a diagnostic magnetic resonance apparatus, in an arbitrary alignment relative to the basic magnetic field direction. The apparatus has no galvanic connection to the reception channel 3 of the magnetic resonance apparatus; signal transmission ensues with magnetic coupling to the reception antenna 5 installed in the magnetic resonance apparatus. Due to the inductively coupled local antenna, the signal contribution in the reception coil 5 is intensified by a factor that roughly corresponds to the quality (Q) of the local antenna.

The apparatus is composed of a triplet of resonant dipole or toroidal coils 2, 4, 6 that are arranged perpendicularly to one another. The dipole coils 2, 4, 6 are respectively tuned by inserted capacitors 8, 10, 12 to the operating frequency of the magnetic resonance apparatus, for example the proton resonant frequency. The resonant coils 2, 4, 6 have the same rectangular geometry in this exemplary embodiment. They are arranged center-symmetrically relative to one another and their respective coil axes, and thus their main imaging regions or sensitivity regions are perpendicular to one another. Respective detuning circuits 14, 16, 18 are connected in parallel with the capacitors 8, 10, 12. The detuning circuits 14, 16, 18 are each composed of two diodes 20 connected with opposite polarities. The excitation of the nuclei ensues (as is known) with reception antenna (not shown), whereby the resonant reception coil arrangements 2, 4, 6 are automatically detuned via the detuning circuits 14, 16, 20. In the transmission case, the diodes 20 short the capacitors 8, 10, 12 as soon as their forward conducting voltage is reached. The resonant condition is thus no longer met. The resonant coil arrangements 2, 4, 6 have no effect in the transmission mode. In the reception mode, significantly lower voltages than the forward conducting voltage are induced in the coil arrangements 2, 4, 6. In the reception mode, the diodes 20 remain in the inhibited condition, the capacitors 8, 10, 12 are effective and the coil arrangements 2, 4, 6 are in resonance.

If the arrangement for inductive coupling should also be active in the transmission mode, the detuning circuits 14, 16, 18 are eliminated in the arrangement. An intensified excitation field then occurs in the imaging area of the resonant coil arrangements 2, 4, 6. In order to effect a predetermined flip angle of the nuclear magnetization, the transmission power can then be reduced in conformity with the signal amplification effect.

When the resonant coil arrangement 2 is placed onto the surface of the subject, then a lower signal intensification is to be expected from the resonant coil arrangements 4 and 6 projecting away from the surface, compared to the resonant coil arrangement 2. In this case, the signal intensification can be improved by utilizing a quadrupole coil 22 in the form of a butterfly coil instead of the resonant dipole coils 4 and 6. The quadrupole coil 22 has a field characteristic that corresponds to that of two oppositely oriented dipole or toroidal cores. The imaging area of the quadrupole coil 22 is located under the crossed middle conductor 23 and is oriented perpendicularly thereto, this being symbolized by a double arrow 24.

Since the quadrupole field generally decreases rapidly with increasing distance, and thus the inductive coupling to the reception coil would become correspondingly weak, a resonant dipole coil 26 is provided perpendicular to the quadrupole coil 22 in the plane containing the middle conductors 23. The dipole coil 26 is highly magnetically coupled to the quadrupole coil 22. The dipole coil 26 communicates the signals to the reception antenna better via the inductive coupling with the quadrupole coil 22 than does the quadrupole coil 22 alone. For tuning to the resonant frequency, respective capacitors 28 and 30 are connected in the quadrupole coil 22 and in the dipole coil 26. Again, the capacitors 28, 30 are connected in parallel with a detuning circuits 32, 34 respectively.

Figure 2:
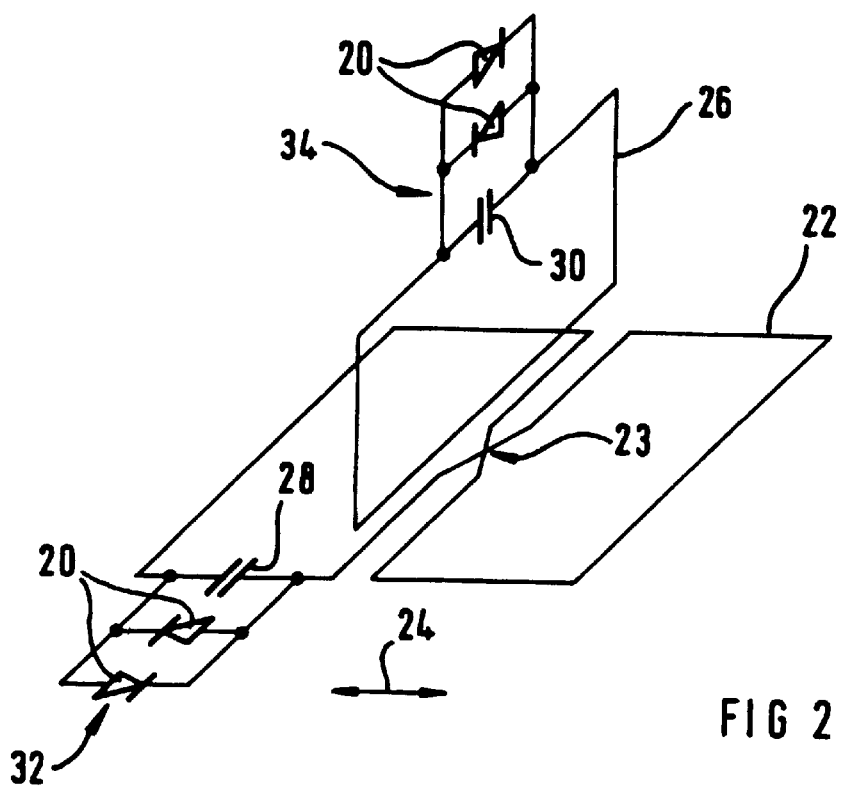
FIG. 2 is a schematic illustration of a resonant quadrupole coil that is coupled to a resonant dipole coil in accordance with the invention.
Figure 3:
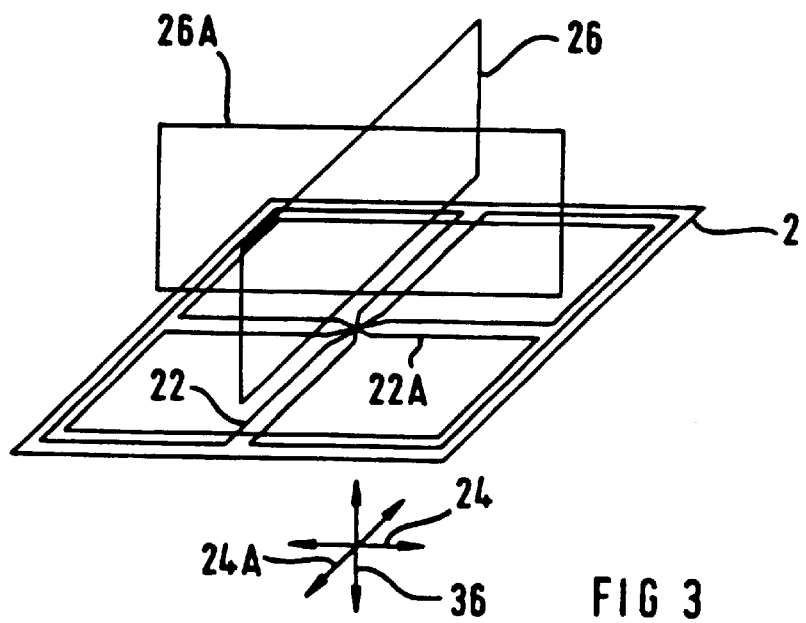
FIG. 3 is a schematic illustration of another embodiment of an inventive apparatus for inductively coupling a nuclear magnetic resonance signal having a resonant dipole coil and two orthogonal, resonant quadrupole coils with appertaining dipole coils.

FIG. 3 shows a further embodiment, wherein a resonant dipole coil 2 and two quadrupole coil arrangements 22 and 22A arranged perpendicularly to one another. The structure of the quadrupole coils 22, 22A has been described above with reference to FIG. 2. The outfeed of the quadrupole signal and transmission to the reception antenna ensues via the dipole coils 26 and 26A. The resonant capacitors and detuning devices are not shown for clarity. The dipole antenna 2 has an imaging area 36 that is aligned axially relative to the conductor loop. The quadrupole coil arrangements 22 and 22A have respective imaging areas 24 and 24A aligned perpendicularly to one another, that are in turn aligned perpendicularly to the imaging area 36.

Figure 4:
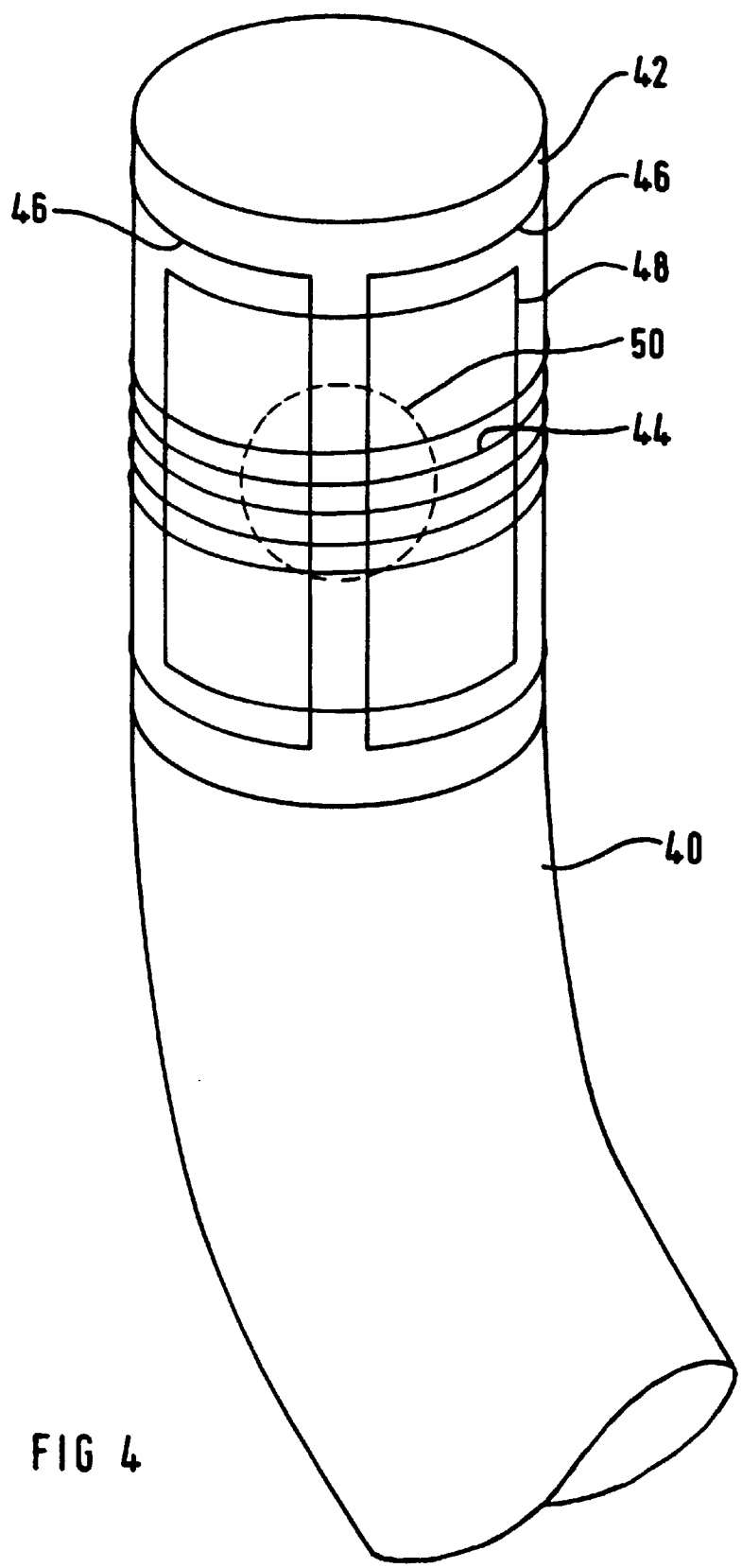
FIG. 4 is a schematic illustration of a third embodiment of an inventive apparatus for inductively coupling a nuclear magnetic resonance signal with a resonant dipole coil and two resonant saddle coil arrangement, all orthogonally relative to one another on a cylindrical surface of an interventional instrument.

FIG. 4 shows a fourth embodiment of the apparatus for inductive coupling of a nuclear magnetic resonance signal. This embodiment is arranged at the tip of a catheter 40 for localization and navigation using nuclear magnetic resonance. Again, three resonant coil arrangements are employed having respective imaging areas that overlap and reside perpendicularly to one another. First, a resonant solenoid coil 44 whose sensitivity area is aligned perpendicular to the cylindrical carrier is arranged on a cylindrical carrier 42. The solenoid coil 44 is an embodiment of a dipole coil and has a number of turns. A resonant capacitor, and a detuning circuit, are used but are not shown here. A second resonant coil arrangement is composed of two resonant saddle coils 46. The saddle coils 46 are identically fashioned and are arranged opposite one another on the surface of the cylindrical carrier 42. Only the front areas of the conductors of the saddle coil 46 are visible in FIG. 5; they continue on the back side of the catheter 40 symmetrically relative to the front side. A third resonant coil arrangement likewise has two saddle coils 48 arranged opposite one another on the cylindrical carrier, these being constructed just like the saddle coils 46 but being rotated by 90° relative thereto. For clarity, resonant capacitors and detuning circuits are not shown for the saddle coils 46, 48, but are nevertheless used.

When the catheter 40 with the device for signal intensification is introduced into the body via blood vessels, the blood flowing through the vessels can be employed as an imaging substance in the magnetic resonance tomogram. Since the imaging areas of the resonant coil arrangements 44, 46, 48 are located within the cylindrical carrier 42, openings must be present in the carrier 42 through which the blood can flow into the interior. Alternatively, the device for inductive coupling fixed to the catheter tip can also be fashioned so as to be closed, in which case a specimen 50 with material supplying nuclear magnetic resonance signals is arranged within the apparatus in the center of the cylindrical carrier 42. For example, the specimen 50 can be in the form of a capsule filled with water, the water being doped with a paramagnetic salt.

The specimen 50 is imaged as a marking in the magnetic resonance tomogram and allows a localization of the tip of the catheter 40 or, in general, of an interventional instrument. It is also possible, however, to localize only the specimen 50 without imaging of the environment with a simple sequence wherein only three gradient fields residing perpendicular to one another are employed. The localization result is then employed in order to enter a mark into images of the subject that have already been produced.

Although modifications and changes may be suggested by those skilled in the art, it is the intention of the inventor to embody within the patent warranted hereon all changes and modifications as reasonably and properly come within the scope of his contribution to the art.

I claim as my invention:

1. An apparatus comprising:
   a magnetic resonance reception antenna; and
   a coil assembly for inductively coupling a nuclear magnetic resonance signal at a known frequency into said reception antenna, said coil assembly having first, second and third resonant coil arrangements each tuned to said resonant frequency and respectively decoupled from each other and having respective imaging regions disposed perpendicularly to each other and at least partially overlapping.

2. The apparatus as claimed in claim 1 wherein each of said first, second and third resonant coil arrangements has a center, and wherein said first, second and third resonant coil arrangements are disposed center-symmetrically relative to each other.

3. The apparatus as claimed in claim 1 wherein at least one of said first, second and third resonant coil arrangements is a resonant dipole coil.

4. The apparatus as claimed in claim 1 wherein at least one of said first, second and third resonant coil arrangements is a resonant quadrupole coil with a resonant dipole coil disposed perpendicularly thereto and magnetically coupled to said quadrupole coil.

5. The apparatus as claimed in claim 1 wherein at least one of said first, second and third resonant coil arrangements is comprised of two resonant saddle coils disposed opposite each other on a cylindrical surface.

6. The apparatus as claimed in claim 1 wherein each of said first, second and third resonant coil arrangements includes a capacitor.

7. The apparatus as claimed in claim 6 wherein each of said first, second and third resonant coil arrangements comprises a detuning circuit connected across the capacitor therein, said detuning circuit comprising two diodes connected with opposite polarities across said capacitor.

8. The apparatus as claimed in claim 1 wherein said first, second and third resonant coil arrangements are respectively connected to detuning circuits.

9. The apparatus as claimed in claim 1 wherein said first, second and third resonant coil arrangements have a common imaging area, and wherein said apparatus further comprises a specimen containing material which supplies nuclear magnetic resonance signals, disposed in said common imaging area, and forming a marking visible in a magnetic resonance tomogram.

10. A medical interventional instrument comprising:
    a medical instrument body having an invasive section adapted for introduction into a subject; and
    an apparatus mounted at said invasive section for inductively coupling a nuclear magnetic resonance signal at a known resonant frequency into a reception antenna, said apparatus comprising three resonant coil arrangements mounted at said invasive section, each of said coil arrangements being tuned to said resonant frequency and being decoupled from one another, said three resonant coil arrangements having respective imaging areas which are disposed perpendicular to each other and which partially overlap.

* * * * *